United States Patent [19]

Nelson et al.

[11] Patent Number: 5,445,308
[45] Date of Patent: * Aug. 29, 1995

[54] THERMALLY CONDUCTIVE CONNECTION WITH MATRIX MATERIAL AND RANDOMLY DISPERSED FILLER CONTAINING LIQUID METAL

[76] Inventors: Richard D. Nelson, 1500 Cliffside Dr., Austin, Tex. 78704; Thomas P. Dolbear, 4009 Eton La., Austin, Tex. 78727; Robert W. Froehlich, 9005 Middlebie Dr., Austin, Tex. 78750

[*] Notice: The portion of the term of this patent subsequent to Jul. 12, 2011 has been disclaimed.

[21] Appl. No.: 263,623

[22] Filed: Jun. 22, 1994

Related U.S. Application Data

[63] Continuation-in-part of Ser. No. 38,420, Mar. 29, 1993, Pat. No. 5,328,087.

[51] Int. Cl.⁶ .............................................. B23K 35/26
[52] U.S. Cl. ................................ 228/121; 228/175; 228/180.22; 361/743
[58] Field of Search ............... 228/175, 180.22, 121.1; 165/185, 80.2, 80.4; 156/273.9, 307.7; 361/743

[56] References Cited

U.S. PATENT DOCUMENTS

| | | | |
|---|---|---|---|
| 3,141,238 | 7/1964 | Herman, Jr. | 228/248 |
| 3,372,310 | 3/1968 | Kanter | 357/75 |
| 3,395,443 | 8/1968 | Polinko, Jr. | 228/208 |
| 3,805,123 | 4/1974 | Rieger | 357/75 |
| 4,098,452 | 7/1978 | Webster et al. | 228/209 |
| 4,233,103 | 11/1980 | Shaheen | 228/233.2 |
| 4,299,715 | 11/1981 | Whitfield et al. | 252/74 |
| 4,398,975 | 8/1983 | Ohsawa et al. | 148/400 |
| 4,403,410 | 9/1983 | Robinson | 29/830 |
| 4,410,457 | 10/1983 | Fujimura et al. | 252/508 |
| 4,435,611 | 3/1984 | Ohsawa et al. | 174/68.5 |
| 4,442,966 | 4/1984 | Jourdain et al. | 228/123 |
| 4,448,240 | 5/1984 | Sharon | 165/80 |
| 4,515,304 | 5/1985 | Berger | 228/136 |
| 4,604,644 | 8/1986 | Beckham et al. | 357/80 |
| 4,611,745 | 9/1986 | Nakahasi et al. | 228/123 |
| 4,732,702 | 3/1988 | Yamazaki et al. | 252/512 |
| 4,740,252 | 4/1988 | Hasegawa et al. | 148/24 |
| 4,740,657 | 4/1988 | Tsukagoshi et al. | 174/88 R |
| 4,740,830 | 4/1988 | Ketley | 357/67 |
| 4,744,850 | 5/1988 | Imano et al. | 361/779 X |
| 4,749,120 | 6/1988 | Hatada | 228/180.22 |
| 4,769,525 | 9/1988 | Leatham | 228/123 |
| 4,769,690 | 9/1988 | Suzuki et al. | 357/67 |
| 4,796,157 | 1/1989 | Ostrem | 357/81 |
| 4,804,132 | 2/1989 | DiFrancesco | 228/208 |
| 4,875,617 | 10/1989 | Citowsky | 228/123 |
| 4,915,167 | 4/1990 | Altoz | 165/185 |
| 4,929,597 | 5/1990 | Takeshita et al. | 29/599 |
| 4,949,220 | 8/1990 | Tashiro | 357/81 |
| 4,995,546 | 2/1991 | Regnault | 228/208 |
| 5,012,858 | 5/1991 | Natori et al. | 165/185 X |
| 5,019,201 | 5/1991 | Yabu et al. | 156/273.9 |
| 5,024,264 | 6/1991 | Natori et al. | 165/1 |
| 5,031,308 | 7/1991 | Yamashita et al. | 29/830 |
| 5,053,195 | 10/1991 | MacKay | 420/555 |
| 5,056,706 | 10/1991 | Dolbear et al. | 228/180.2 |
| 5,062,896 | 11/1991 | Huang et al. | 106/287.19 |
| 5,123,986 | 6/1992 | Sugiyama et al. | 156/230 |
| 5,147,210 | 9/1992 | Patterson et al. | 29/830 X |
| 5,170,930 | 12/1992 | Dolbear et al. | 228/123 |
| 5,183,969 | 2/1993 | Odashima | 156/273.9 |
| 5,225,157 | 7/1993 | McKay | 420/525 |
| 5,235,741 | 8/1993 | Mase | 29/830 |
| 5,258,577 | 11/1993 | Clements | 361/779 X |
| 5,323,294 | 6/1994 | Layton | 165/185 X |
| 5,328,087 | 7/1994 | Nelson et al. | 228/175 |

OTHER PUBLICATIONS

Tikhomirova, et al., "Soldering Copper with Copper-Gallium Solders," *Svar. Proiz.*, No. 10, 1967, pp. 16–18.

(List continued on next page.)

*Primary Examiner*—Kenneth J. Ramsey

[57] ABSTRACT

A method of providing a thermally conductive connection between spaced surfaces includes (a) mixing a thermally conductive filler containing a liquid metal into an unhardened matrix material, and (b) contacting the unhardened matrix material and randomly dispersed, separate spaced non-solidified regions of filler within the unhardened matrix material to the surfaces. A solid mechanical bond may be provided by hardening the matrix material or by providing a separate adhesive between the surfaces. Preferably, the regions of filler form separate spaced continuous thermally and electrically conductive paths between the surfaces.

39 Claims, 7 Drawing Sheets

OTHER PUBLICATIONS

Harman, "Hard Gallium Alloys for Use as Low Contact Resistance Electrodes and for Bonding Thermocouples into Samples," *The Review of Scientific Instruments*, vol. 31, No. 7, Jul. 1960, pp. 717–720.

Tikhomirova, et al., "Effect of the Particle Shape and Size of a Second Component on the Properties of the Gallium Solders," *Poroshkovaya Matallurgiya*, No. 12(84), Dec. 1969, pp. 51–56.

Darveaux et al., "Thermal/Stress Analysis of a Multichip Package Design," *Proceedings of the 39th Electronic Components Conference*, 1989, pp. 668–671.

Nayak et al, "A High Performance Thermal Module for Computer Packaging," *Journal of Electronic Materials*, vol. 16, No. 5, 1987, pp. 357–364.

Hwang et al, "A Thermal Module Design for Advanced Packaging," *Journal of Electronic Materials*, vol. 16, No. 5, 1987, pp. 347–355.

Product Brochure entitled "Indalloy TM Fusible Alloys Available" by Indium Corporation of America, Utica, N.Y. (date unknown) pp. 1–5.

Product Brochure entittle "Z link TM Multilayer Technology" by Sheldahl, Inc., Northfield, Minn., (date unknown) pp. 1–8.

Technical Bulletin entitled "DieGlas TM Die Attach Material Processing Recommendations" by Alphametals, Jersey City, N.J., Feb. 1992, pp. 1–2.

Product Brochure entitled "High Performance Electronic Materials Manufactured by A. I. Technology, Inc." by A. I. Technology, Inc., Princeton, N.J. (date unknown) pp. 1–5.

P. Bujard, "Thermal Conductivity of Boron Nitride Filled Epoxy Resins: Temperature Dependence Influence of Sample Penetration", *Intersociety Conference on Thermal Performance in the Fabrication and Operation of Electronic Components 1988*, Los Angeles, Calif., May 11–13, 1988, pp. 41–49.

Thomas Dolbear, "Liquid Metal Paste for Thermal Connections", *Proceedings of the International Electronic Packaging Society (IEPS)*, Sep., 1992, pp. 475–485.

"IBM Technical Disclosure Bulletin" vol. 31, No. 5, Oct. 1988, p. 34.

Hansen, Constitution of Binary Alloys, McGraw-Hill, 1958, pp. 22 & 96.

Keeler, "Liquid Interconnects For Fine Pitch Assembly?" *Electronic Packaging & Production*, vol. 14, Jun. 1989.

Glushkova et al, "Gallium-Copper and Gallium-Nickel Paste Solders," *Svar. Proiz.*, No. 11, 1968, pp. 36–37.

THERMALLY CONDUCTIVE CONNECTION WITH MATRIX MATERIAL AND RANDOMLY DISPERSED FILLER CONTAINING LIQUID METAL

CROSS-REFERENCE TO RELATED APPLICATIONS

This is a continuation-in-part of U.S. application Ser. No. 08/038,420 filed Mar. 29, 1993, U.S. Pat. No. 5,328,087 which is incorporated herein by reference.

BACKGROUND OF THE INVENTION

1. Field of the Invention

The invention relates to thermally conductive connections, and more particularly to a matrix material mixed with a thermally conductive, randomly dispersed filler containing a liquid metal for making thermally connecting surfaces such as electronic components.

2. Description of Related Art

Packaging of electronic components involves establishing interconnections and a suitable operating environment for predominantly electrical circuits to process or store information. The quest for higher levels of integration drives technologies to produce smaller and smaller devices, interconnections and terminals. This demands increased power capability to supply high currents at tight voltage-drop tolerances.

Increased power consumption generates increased heat. Thermal expansion caused by heating up the components, however, is not uniform. Thermal expansion varies with temperature gradients and mismatches between coefficients of thermal expansion. Mechanical stresses result from these differences which contribute to the finite lifetime and failure rate of the components. Moreover, the components have limited temperature tolerance. For instance, integrated circuit chip temperatures must often be below 100° C. to assure proper and reliable electrical performance. As a result, heat transfer and heat removal techniques have become critical.

An important aspect of heat conduction in microelectronic packages is the transfer of heat across the interface of two surfaces, for example an integrated circuit chip mounted on an electrical interconnect substrate. Generally, when two surfaces are pressed together the contact is imperfect and the actual heat transfer area of the joint is only a small fraction of the total area. This constriction and then spreading of the heat flux in the vicinity of the joint is manifested by a temperature drop at the interface, which results in increased thermal resistance.

Thermally conductive adhesives with dispersed solids have been devised for heat sink attachment of electrical components and for attachment of integrated circuit chips to substrates and other packaging structures. Silver filled epoxies and the like for electrical and thermal interface connections are well known. A primary goal is to provide both a dependable mechanical bond and a highly conductive path for heat flow. Although the basic theory of this method appears sound, in practice this method may have serious drawbacks. Since the thermal conductivity of such adhesives depends on the ability of the solids within the adhesives to contact each other and the surfaces to be joined, limited contact areas introduce constriction resistance and reduce the thermal conductance of the joint. Similar problems arise for electrically conductive adhesives resulting in reduced electrical conductance.

There has been some recent activity directed towards overcoming this primary shortcoming. A main thrust has been the use of low temperature solder (or fusable alloy) fillers with melting points (or melting ranges for non-eutectics) between approximately 40° C. and 100° C. A bond is formed by melting and resolidifying the metal. Tin, gold, solder and various alloys may be used.

Solder fillers can be liquid at the cure temperature of the adhesive thereby enhancing the surface contact and later solidify at room temperature. Such solder fillers include tin-bismuth based solders (e.g., 52/30/18 Bi/Pb/Sn) and indium-based solders (e.g., 95/5 Ga/In, 66.3/33.7 In/Bi). For example, U.S. Pat. No. 5,062,896 by Wu-Song Huang discloses a paste which contains a meltable alloy (solders of the Bi/Sn, Bi/Sn/Pb, and Pb/Sn systems) in a solution of a polymer dissolved in a solvent such as NMP with a transient fluxing agent and an optional surfactant. Solder reflow occurs at a temperature in the range of approximately 160° C. to 250° C. The fluxing agent is driven off primarily as vapor during reflow and the surfactant if present is likewise driven off as a gaseous by-product of the process. The joint appears to contain a solid solder connection throughout its operation.

Fusion bonding is reported by Sheldahl, Inc. of Northfield, Minn. in a product brochure entitled "Z LINK ™ Multilayer Technology". Sheldahl uses a solder filled polymer to make electrical connections between copper traces on printed circuit board laminates by creation of fusion bonds. The product brochure does not call out melting the solder but this seems to be preferable and require a reflow temperature on the order of 160° C. Likewise, the brochure fails to call for flux but flux and/or an acidic preclean of the surfaces being joined appears necessary to insure proper wetting.

Although rendering solder fillers molten provides better surface contact than, say, silver filled epoxies, significant drawbacks arise, particularly after resolidification. Solders appear to require heating well above their melting point (approx. 100° C.) to wet the surfaces being joined, require flux unless the surfaces are reduced immediately prior to bonding, lack physical compliance, are prone to deformation and fatigue, and are unable to wet most materials besides metals.

Other known methods of making thermally conductive joints include the use of greases, viscous liquids or liquid metals between surfaces. These methods, however, generally fail to provide structural or adhesive support and, further, the grease or liquid can migrate out of the interface, destroying its conductance or contaminating other parts of the assembly.

The electrical characteristics of packaging interconnections are often key performance denominators. Signal interconnections and terminals constitute the majority of conducting elements, whereas other conductors supply power and provide ground or other reference voltages. Connections between chip and package are commonly performed by one of three technologies: wirebond, tape-automated-bonding (TAB), and Controlled Collapse Chip Connection (C4) also called "flip chip". The best approach depends on thermal considerations, the number and spacing of I/O connections on the chip, and cost. Whichever the approach, an electrically conductive connection must be made between the chip and an external lead or component.

Conductive adhesives for electrical interconnection are known in the art. For example, U.S. Pat. No. 5,258,577 by Clements discloses an adhesive prepared by mixing an adhesive resin and a metal powder together uniformly to suspend the metal powder within the adhesive, the adhesive is placed between nonuniform surfaces so as to vary the concentration of particles, pressure is applied, and the adhesive is cured whereby only the concentrated resin is intended to provide conductive paths between the bonded surfaces. Likewise, U.S. Pat. No. 4,744,850 by Imano et al. discloses a mixing solid uniform particles such as gold, silver, copper or nickel into a heat sensitive adhesive such as polyethylene resin, disposing the mixture between a chip and a base, and applying pressure and heat to harden the adhesive. U.S. Pat. No. 4,233,103 by Shaheen discloses a a homogeneous mixture of polyimide resin and an alloy of gallium-tin eutectic and gold whereby gallium is heated, tin is mixed into the melted gallium, the combination is cooled to form gallium-tin eutectic which is mixed with gold powder, the mixture is triturated until the gold dissolves, and the resultant alloy of gallium-tin eutectic and gold is stirred in a polyimide resin solution to obtain a homogeneous adhesive formulation with evenly distributed components and paste-like consistency. These approaches, however, fail to provide separate spaced thermal paths which can wet the components to form wide-area surface contact at relatively low temperatures.

Consequently, there is a need for a thermally conductive bonding material which can provide thermal as well as electrical conductivity in separate spaced regions, mechanical strength, wetting at low temperatures, and ease of application.

SUMMARY OF THE INVENTION

An object of the present invention is to provide an thermally conductive connections between surfaces with improved thermal conduction characteristics.

One embodiment of the present invention discloses a thermally conductive connection comprising a matrix material and a non-solidified filler containing a liquid metal dispersed in separate spaced regions of the matrix material. The filler in the regions provides continuous thermal and electrical metal "bridges" extending through the matrix material between the surfaces. Either the matrix material or a separate adhesive may provide a solid mechanical bond between the surfaces.

A feature of the present invention is a method of providing a thermally conductive connection between spaced surfaces, comprising the steps of (a) mixing a thermally conductive filler containing a liquid metal into an unhardened matrix material, and (b) contacting the unhardened matrix material and randomly dispersed, separate spaced non-solidified regions of the filler within the unhardened matrix material to the surfaces.

In certain embodiments of the present invention the liquid metal can be gallium; the filler can be a liquid metal, a liquid metal alloy, a non-solidifying paste comprising a liquid metal and particulate solid constituents, or an amalgam; and the matrix material can be a liquid, a gel, a grease, an oil, a paste, as well as a thermoplastic material, a thermosetting material, an ultra-violet curable material, an epoxy or a solvent-bearing material. Various combinations of these materials are also suitable.

The filler may be dispersed into the unhardened matrix material, for instance, by mixing filler into a liquid adhesive or partially cured adhesive. Or the filler may be dispersed in a flexible adhesive film by forming vias in the film and then depositing filler into the vias.

The filler must be non-solidified at some time during contact with the surfaces while the matrix material is unhardened. The filler may otherwise be solid. For instance, when the filler is dispersed in the unhardened matrix material the filler may be in liquid or solid state. Furthermore, the filler need not necessarily remain non-solidified after it contacts the surfaces. The filler may remain non-solidified as the matrix material is hardened and later solidify by amalgamation or temperature decrease. If later solidified, the filler may again be rendered non-solidified by temperature increase in order to facilitate shearing the connection during rework.

The adhesive material of the present invention can also be used to provide a thermally conductive, electrically insulative connection between the surfaces. For example, the regions of filler may fail to provide continuous paths between the surfaces. Alternatively, one of the surfaces can be an insulating layer coated on an electronic component. In another alternative, an insulative coating may surround electrically conductive regions of the liquid metal thereby rendering the filler electrically insulative.

In still another embodiment of the present invention, the filler is electrically conductive and the matrix material is electrically insulative. In this manner the filler regions may form anisotropic electrical connections between matching pairs of electrical pads on the surfaces without connecting any non-matching pads.

If desired, spacer particles can be disposed in the matrix material thereby assuring a predetermined spacing between the surfaces.

A primary advantage of the present invention is the ability to make more extensive thermal and electrical contact between the joined surfaces than is possible with conventional solid particle fillers.

Another advantage of the present invention is the ability to bond at temperatures in the range of approximately 5° C. to 30° C., depending on the melting point of the liquid metal or liquid metal alloy.

A further advantage of the present invention is the wide variety of matrix materials which may be used in comparison to solder-based filler compositions.

An additional advantage of the present invention is the ability to bond surfaces having highly different coefficients of thermal expansion.

Yet a further advantage of the present invention is a low elastic modulus resulting in relatively low stresses placed on the bonded surfaces.

Still another advantage of the present invention is the ability of the filler to wet surfaces, particularly ceramics such as alumina and aluminum nitride, and thus make wide-area surface contact without the need for flux or acidic precleaning of the surfaces.

Yet a further advantage of the present invention is a relatively low assembly pressure.

A still further advantage of the present invention is the ability to form electrically conductive thermal bonds between integrated circuit chips and electrical interconnect substrates.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
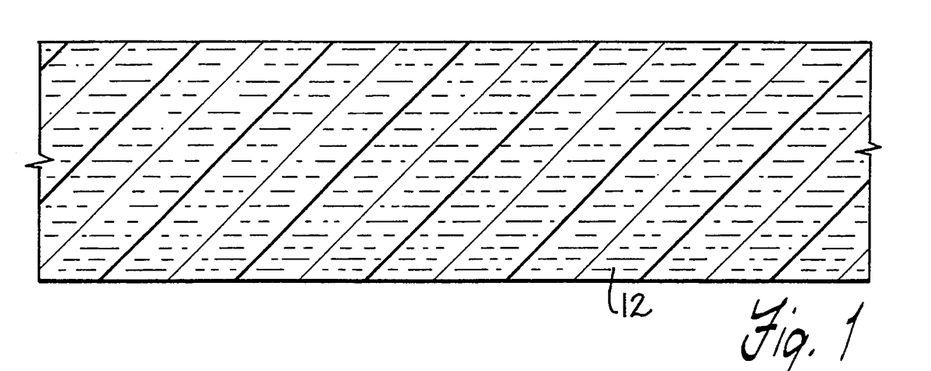
FIG. 1 shows in cross-section an unhardened matrix material according to a first embodiment of the present invention.

Referring now to FIG. 1, the thermally conductive connection of the present invention is prepared by providing an unhardened matrix material. In this embodiment, the unhardened matrix material is an adhesive which can be rendered harder, such as thermoplastic materials (hardenable by lowering the temperature), thermosetting and ultra-violet curing materials, two-part epoxies, and silcone gels (each hardenable by chemical reaction), and solvent-bearing materials (hardenable by loss of solvent). For illustration purposes, a liquid epoxy 12 is used. It is understood, however, that the matrix material of the present invention need not necessarily be hardened. Suitable matrix materials include various liquids, gels, greases, oils and pastes. Furthermore, the matrix material of the present invention may comprise, consist essentially of, or consist of an oil such as silicone oils and hydrocarbon oils.

Figure 2:
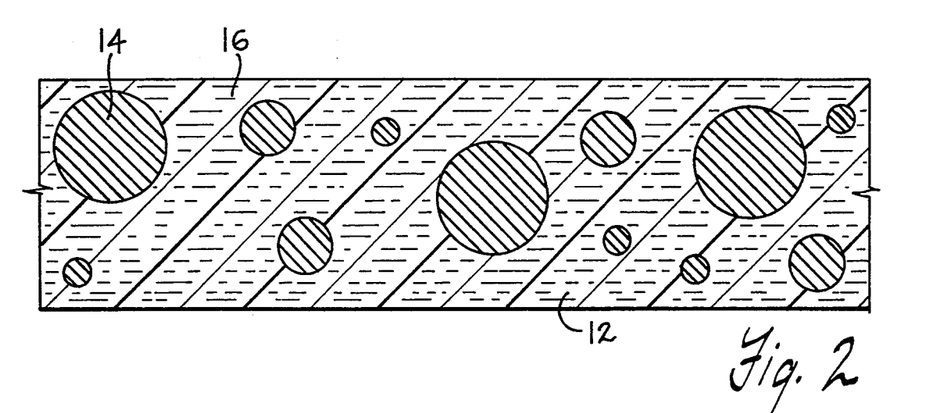
FIG. 2 shows the unhardened matrix material of FIG. 1 mixed with a filler containing a liquid metal.

Referring now to FIG. 2, a filler containing a liquid metal is provided, and is dispersed into the unhardened matrix material. For example, liquid gallium 14 is mixed into liquid epoxy 12. Liquid metal is a key component of the thermally conductive connection of the present invention due to its excellent thermal conductivity as well as its liquidity. It should be noted that liquid metals tend to have excellent electrical conductivity as well. As used herein, the term "liquid metal" is defined as being gallium, mercury, or a compound containing gallium or mercury. That is, the "liquid metals" of the present invention are a class of materials, based on chemical composition, which remain so named even if cooled and solidified. Liquid metals and liquid metal compounds suitable for the present invention, by way of example and not limitation, are set forth in TABLE 1 below.

TABLE 1

Liquid Metals (Melting Point)
Gallium (30° C.)
Gallium/Tin (16° C.)
Gallium/Indium (15° C.)
Gallium/Indium/Tin (5° C.)
Any of the above with Mercury, Cadmium, and Bismuth
Mercury (−39° C.)
Mercury/Zinc (−41.6° C.)

Numerous liquid metal bearing materials and combinations of materials are well suited as the filler of the present invention. For instance, the filler may consist of or consist essentially of the liquid metal. The filler can be a liquid metal or a liquid metal alloy. Preferred liquid metal alloys comprise gallium with one or more of tin, bismuth and cadmium. The filler may also be a non-solidifying liquid metal paste comprising liquid metal and solid particulate constituents as described by Thomas P. Dolbear et al. in U.S. Pat. Nos. 5,056,706 and 5,170,930 which are incorporated herein by reference. Preferably, the non-solidifying paste comprises an equilibrium mixture of the liquid metal and particulate solid constituents wherein at the temperature of the paste during connection to external surfaces, as shall be described below, the proportions of liquid metal and particulate solid constituents remain between the ultimate liquids and the ultimate solidus of the phase diagram of the mixture and the paste remains non-solidified. The filler may also be a paste which reacts to form an amalgam and solidifies, as described by Colin A. MacKay in U.S. Pat. Nos. 5,053,195 and 5,225,157 which are incorporated herein by reference.

It should also be noted that the filler may be liquid or solid particles when mixed into the unhardened matrix material.

Liquid metal and liquid metal pastes are the preferred fillers of the present invention. As non-solidified fillers, they have numerous advantageous characteristics: 1) no plastic deformation or fatigue, 2) low elastic modulus, 3) physical compliance and the ability to maintain contact across surfaces despite local deformations occurring due to different coefficients of thermal expansion of the surfaces being bonded or "adhesive creep", 4) low melting point allowing assembly of temperature sensitive components, 5) usable with a wide variety of adhesives, and 6) high electrical conductivity. Liquid metal pastes also have higher thermal conductivity than solder-based fillers.

Figure 19:
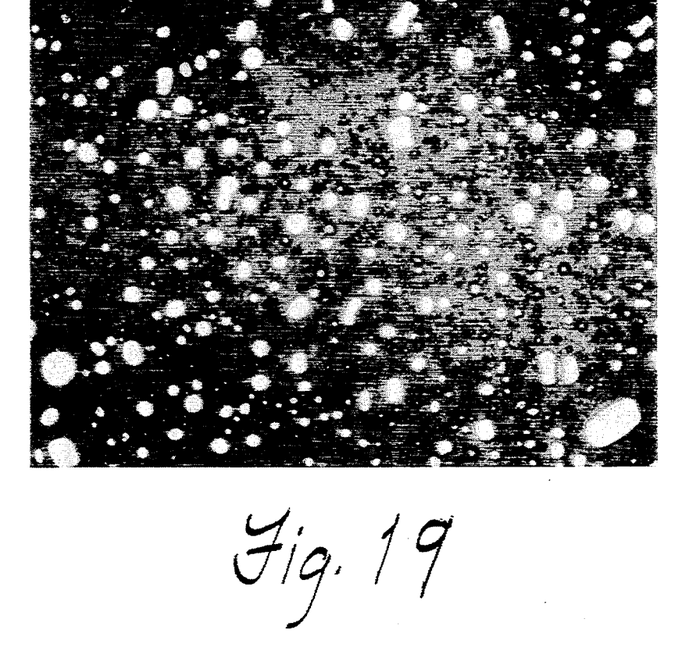
FIG. 19 is a photomicrograph of the interface side of a transparent surface bonded to an adhesive material in accordance with the present invention.
Figure 20:
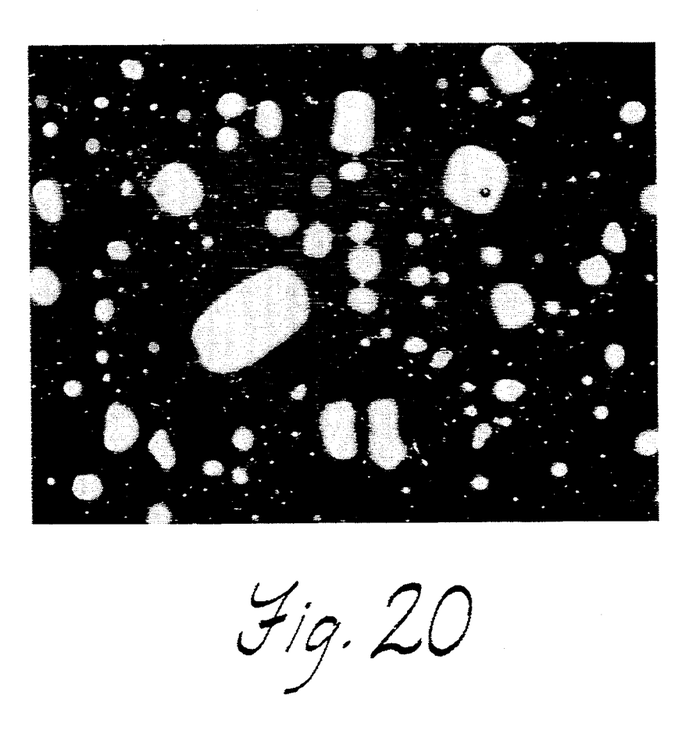
FIG. 20 is a photomicrograph similar to FIG. 19 at higher magnification.

Gallium is the preferred liquid metal. Gallium has outstanding ability (comparable with germanium) to wet a host of materials. These materials include ceramics such as alumina and aluminum nitride, glasses (as shown in FIGS. 19–20) and metals. Moreover, gallium wets materials which oxidize including copper, tungsten, molybdenum and tantalum. This is due to the fact that gallium oxide present on liquid gallium tends to enhance wetability. This is unlike solder compositions which are inhibited by oxides on the solder or surfaces being joined and which fail to wet ceramics lacking appropriate metallizations. Thus, gallium based fillers have unique properties over and above conventional solders. The elimination of fluxes is also environmentally appealing as the handling of related by-products is avoided. As with solders, however, gallium does not wet all materials and is not compatible with certain materials such as aluminum. In some instances appropriate surface coatings or preparations are needed for gallium, as further described below.

Mercury, unfortunately, has a low vapor pressure which may be problematic in certain applications.

In certain applications it may be preferable to use a thermally conductive, electrically resistive filler. This can be acheived by surrounding electrically conductive regions of the liquid metal with an insulative coating. See, for instance, U.S. Pat. Nos. 4,740,657 and 5,123,986.

Referring still to FIG. 2, surface tension differences between liquid epoxy 12 and liquid gallium 14 result in mixture 16 with a fine dispersion of sphere-like regions of gallium 14 approximately 1–80 mils in diameter. Preferably, liquid gallium 14 is in the range of 20% to 70% of mixture 16 by volume and liquid epoxy 12 is sufficiently viscous to prevent the spheres of gallium 14 from coalescing or separating. A sufficiently viscous epoxy may be obtained by partially curing the epoxy prior to dispersing the liquid gallium therein. Finally, gallium 14 is in liquid state during mixing for illustration purposes only; solid particles of gallium 14 can also be used. More generally, the filler of the present invention preferably occupies 20% to 70%, and more preferably 30% to 50%, of the volume of the filler/matrix material mixture of the present invention.

Figure 3:
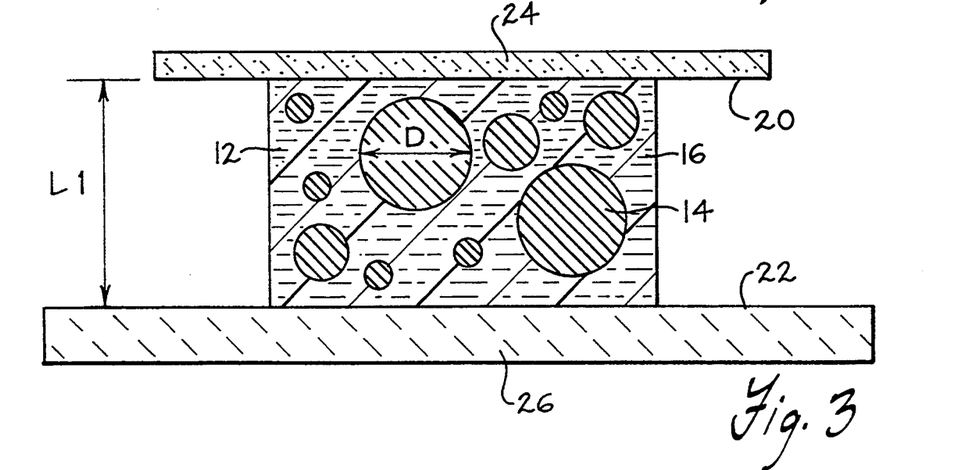
FIG. 3 shows the mixture of FIG. 2 disposed between a pair of surfaces.

Referring now to FIG. 3, the unhardened matrix material is placed in contact with the surfaces to be bonded. As may be seen, mixture 16 of liquid epoxy 12 and gallium 14 is disposed between a pair of opposing top major surfaces 20 and 22 of integrated circuit chip 24 and electrical interconnect substrate 26, respectively. Mixture 16 could initially be applied to surface 20, surface 22, or both. It is noted that surfaces 20 and 22 are separated by a length L1 greater than characteristic distance D of the substantially spherical gallium regions. In addition, while some mixtures produce spheres of filler, other mixtures may produce more general and random shapes and sizes of the filler, especially if the liquid adhesive is highly viscous.

Figure 4:
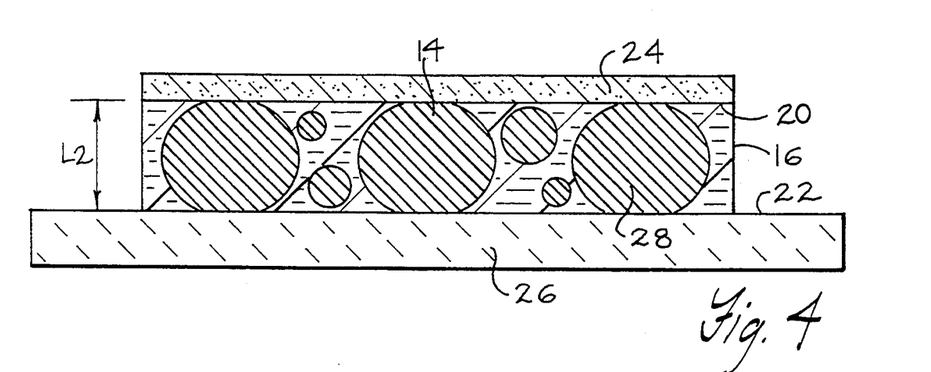
FIG. 4 shows the assembly of FIG. 3 with the surfaces brought closer together so that separate spaced regions of non-solidified filler form continuous thermally conductive paths between the surfaces.

Referring now to FIG. 4, separate spaced regions of the dispersed filler in a non-solidified state are now be brought in contact with (and preferably wet) the surfaces without contacting any other of such filler regions. In this embodiment, surfaces 20 and 22 are brought closer together until separated by a length L2 less than or equal to (preferably slightly less than) distance D. This smears mixture 16 across the surfaces and forms regions 28 of gallium 14. Regions 28 are separate from one another and provide a continuous path of gallium 14 between and in contact with surfaces 20 and 22. Gallium 14 must be in liquid state at least temporarily during contact with surfaces 20 and 22 to make proper electrical and thermal contact. Preferably, gallium 14 wets surfaces 20 and 22 thereby enhancing the contact. In addition, gallium 14 should be compatible with (not attack) surfaces 20 and 22. Finally, it is noted that after contacting surfaces 20 and 22 it is no longer essential that gallium 14 remain non-solidified. It should be noted that gallium 14 in each region 28 provides a separate continuous thermally and electrically conductive path between and in contact with surfaces 20 and 22. Advantageously, the paths can be formed at a relatively low temperature, preferably at most 160° C., more preferably between 40° C. to 100° C., and most preferably at room temperature.

Figure 5:
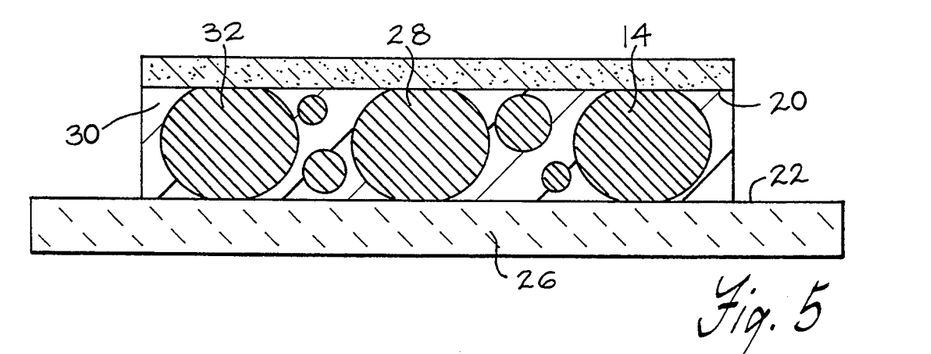
FIG. 5 shows the assembly of FIG. 4 after hardening the matrix material to form a solid mechanical bond between the surfaces.

Referring now to FIG. 5, if desired, the unhardened matrix material is transformed into a solid mechanical bond between the surfaces. The applicable transformation process depends on the particular matrix material, as previously discussed. For illustration purposes, liquid epoxy 12 is cured to form a solid epoxy 30 wherein the gallium 14 in regions 28 forms separate, spaced metal bridges 32 between and in contact with surfaces 20 and 22. Epoxy 30 yields a secure mechanical bond as is preferred. Bridges 32 are thin metal joints with relatively wide contact areas, providing highly conductive thermal and electrical paths between surfaces 20 and 22. As such, bridges 32 are thermally superior to the limited metal contact provided by prior art adhesives containing solid particle fillers such as silver filled epoxies.

The matrix material may be solid, but need not necessarily be. For instance, thermoplastic materials typically provide high strength bonds. However, the matrix material could be stiffened, thickened or highly viscous and the like, without being solid or secure. Preferably, some mechanical bonding of the surfaces occurs. Silicone gel, in particular, will polymerize and cross-link, but to a lesser extent than many other adhesives, and thus provides a relatively weak mechanical bond. In certain applications, matrix materials that provide little or no adhesion may require additional support to maintain a reliable mechanical bond during vibration or whatever other loading which may occur during operation.

If the filler is to be solidified, this may occur before, during, or after the matrix material is hardened. The filler can also be solidified dependently or independently of hardening the matrix material. The choice depends on the filler employed, the transformation process, the intended use of the filler and so on. The filler need only be non-solidified when the separate spaced regions of filler contact the surfaces and the matrix material is unhardened. This assures a wider area contact with the surfaces than would be possible if the filler were continually solid. In the embodiment shown in FIG. 4, an unhardened matrix material is contacted to both surfaces. An alternative approach (not shown) is by contacting unhardened matrix material which is thermoplastic and a first plurality of filler regions to only one of the surfaces, transforming the unhardened matrix material into a solid matrix material, contacting the solid matrix material to the other surface, transforming the solid matrix material back into an unhardened matrix material thereby contacting the unhardened matrix material and a second plurality of filler regions to the other surface, then transforming the unhardened matrix material into a solid (for the second time) thereby providing a solid mechanical bond between the surfaces. It is noted that the first and second plurality of filler regions may cover the same or many of the same filler regions.

One approach to solidifying the filler is by temperature decrease. For instance, liquid metal or liquid metal paste fillers remain non-solidified regardless of the adhesive hardening process unless the temperature falls below a characteristic melting point. Furthermore, a solidified (cooled) liquid metal, liquid metal paste, or low temperature solder may again be rendered non-solidified by temperature increase, for instance by operating the bonded components, or by providing an external heat source. On each cycle, or every melting, the filler will recover whatever plastic damage occurred when it was solid thereby eliminating fatigue. In addition, the remelted filler facilitates shearing the bond during a rework or disassembly operation.

The filler can also be solidified by amalgamation. Amalgam paste fillers solidify with time regardless of the adhesive hardening process, although applying heat or ultra-violet energy may increase the rate at which the amalgam solidifies. One such amalgam paste is a mixture of gallium, copper and nickel. A Ga/Cu/Ni paste will, with time, amalgamate and form a solid bond. If the Ga/Cu/Ni paste, while still viscous, is dispersed in epoxy, then the elevated temperature cycle used to cure the epoxy will also accelerate the solidification of the Ga/Cu/Ni paste. Advantageously, certain amalgams expand slightly during solidification, whereas certain epoxies shrink, especially during cooling. Under these conditions, thermal bridges 32 form in a state of compressive pre-load at room temperature in which a constant pressure against the surfaces assures that good thermal and electrical contact is retained between the bonded surfaces. It should also be noted that the adhesive is far more likely to harden before the amalgam filler hardens. Amalgam fillers have advantages over solder-based fillers, including higher melting points, less susceptibility to fatigue, and the ability to utilize the excellent wetting capability of gallium. Amalgams also eliminate possible long-term corrosive action which may occur with liquid metals and liquid metal pastes.

Figure 6:
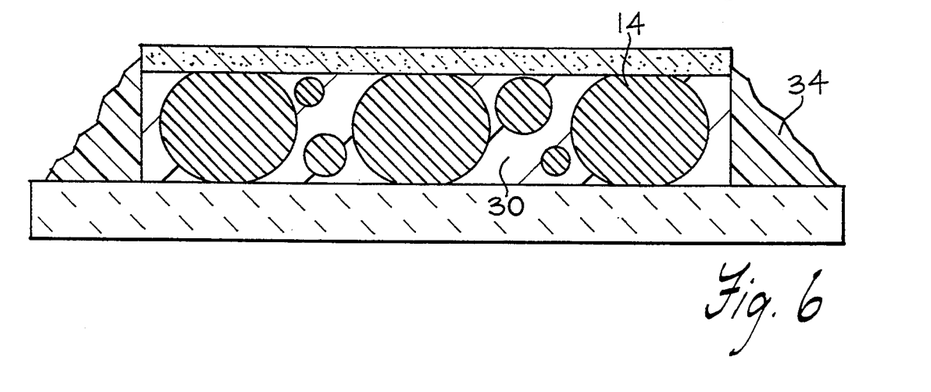
FIG. 6 shows the assembly of FIG. 5 further including an additional adhesive contacting the surfaces and surrounding the bond.

Referring now to FIG. 6, an optional adhesive is shown surrounding the edges of the matrix material to provide further containment and/or mechanical strength. The adhesive should be chosen both for its compatibility with the matrix material and its ability as an encapsulant to exclude moisture. Suitable adhesives include silicones, epoxies and acrylics. The adhesive can be applied either before, during or after the matrix material is hardened. The adhesive is particularly useful for containment purposes if the matrix material remains unhardened. In the present embodiment, 5–20 mils of a silicone gel 34, like Dow Corning HIPEC 6646 which is used in various packaging applications, serves as the adhesive. Gel 34 could be a non-filled region of liquid epoxy 12 which is made harder simultaneously with curing liquid epoxy 12 into solid epoxy 30. It should be noted that without the adhesive, the hardened matrix material encloses and retains most or all of any non-solidified filler and thus minimizes or eliminates leakage as compared to liquid metals, pastes, or thermal greases per se. The degree of containment and/or need for encapsulation depends on materials selection, the amount of filler, the sensitivity of nearby components, etc. For instance, epoxy 30 normally provides complete containment for gallium 14. Yet silicone gel 34 provides still greater containment against diffusion of liquid gallium into undesired locations. Of course, the use of a solidified filler and matrix material during operation eliminates containment problems. Therefore, the adhesive is not considered an essential aspect of the present invention but may be preferred when it is critical to contain a non-solidified filler and/or matrix material.

Referring now to FIGS. 7–10, there is seen another embodiment of the present invention wherein like parts similar to those previously discussed are similarly numbered. In this embodiment, the unhardened adhesive is a flexible adhesive film and the filler is dispersed by forming vias in the film and depositing the non-solidified filler into the vias.

Figure 7:
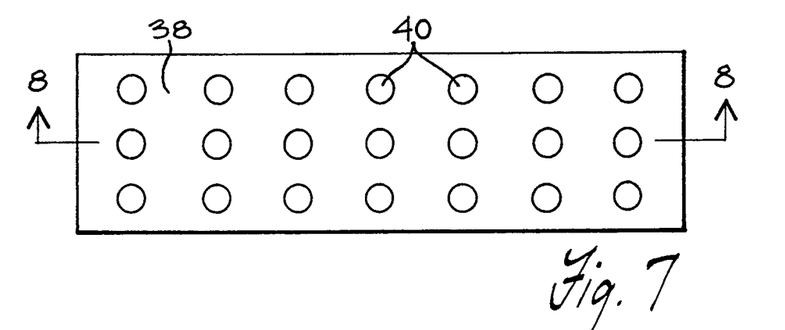
FIG. 7 shows a top plan view of a flexible adhesive film with patterned vias according to another embodiment of the present invention.

Referring now to FIG. 7, there is shown a top plan view of a flexible adhesive film with a patterned matrix of vias. Flexible adhesive film may be a solid (but unhardened) film such as a thermoplastic, or B-staged film such as a partially cured thermosetting material. For illustration purposes a partially cured thermosetting film 38 is depicted. Separate, spaced through-holes or vias 40 are formed between the top and bottom surfaces of film 38 by any conventional means including laser drilling and screening.

Figure 8:
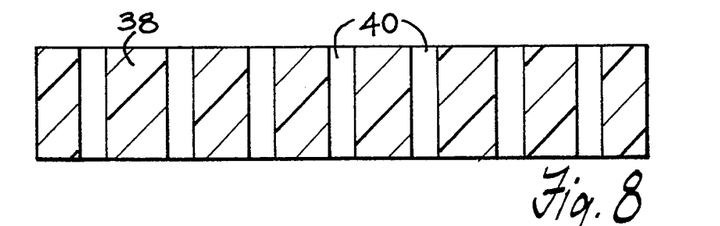
FIG. 8 shows a cross-sectional view of the film taken along line 8—8 of FIG. 7.

Referring now to FIG. 8, there is shown a cross-sectional view of film 38 taken along line 8—8 of FIG. 7. As may be seen, vias 40 extend vertically between the planar top and bottom film surfaces of film 38. Film 38 is 1–30 mils thick, vias 40 are 1–25 mils in diameter.

Figure 9:
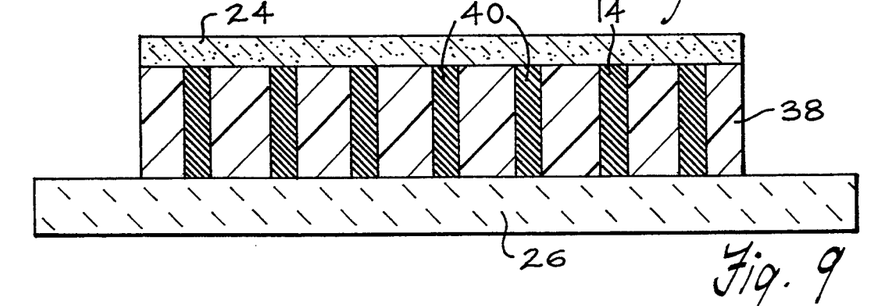
FIG. 9 shows the film of FIG. 8 with filler in the vias and disposed between a pair of surfaces.

Referring now to FIG. 9, the filler is deposited into the vias and the film and filler are placed in contact with a pair of surfaces. As shown, film 38 is disposed on electrical interconnect substrate 26 and liquid gallium 14 is deposited such as by squeegeeing into vias 40. Thereafter, integrated circuit chip 24 is disposed on film 38.

Figure 10:
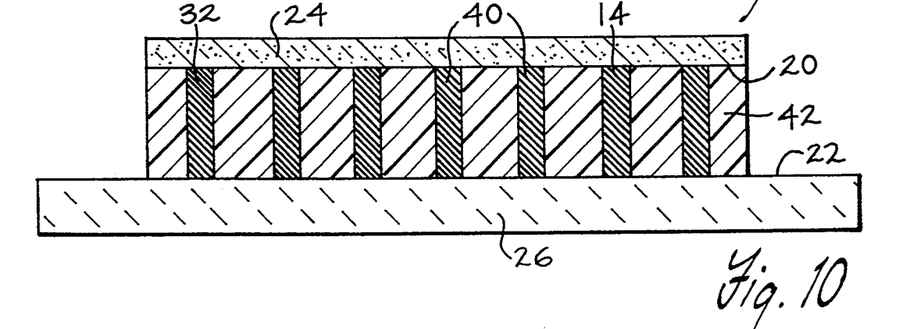
FIG. 10 shows the assembly of FIG. 9 after hardening the film to form a solid mechanical bond between the surfaces with the filler in the vias forming continuous thermally conductive paths between the surfaces.

Referring now to FIG. 10, film is transformed into a harder film. In this embodiment, film 38 is cured to form hardened film 42 (darker shade) which provides a solid mechanical bond between the surfaces 20 and 22. As is seen, the gallium 14 in vias 40 provides continuous thermally and electrically conductive paths or bridges 32 between the surfaces 20 and 22.

Figure 11:
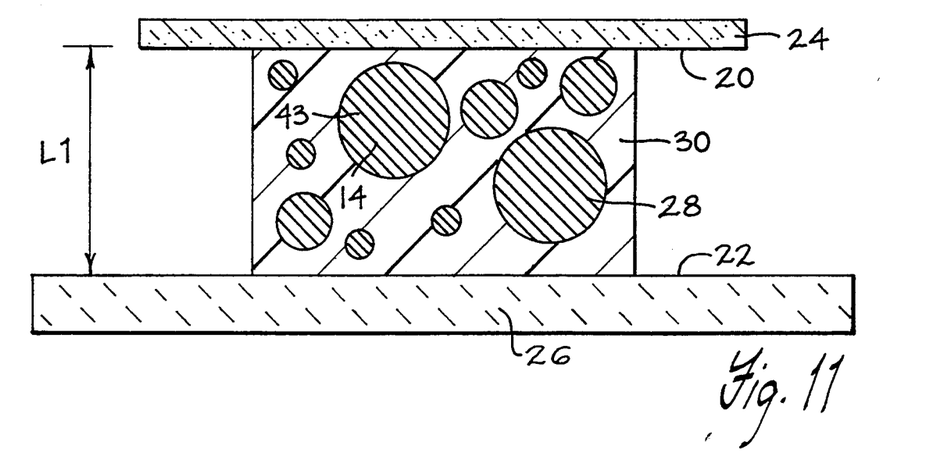
FIG. 11 shows an assembly similar to FIG. 3 in which the matrix material is hardened without bringing the surfaces closer together so that the filler provides discontinuous thermally conductive paths between the surfaces.
Figure 12:
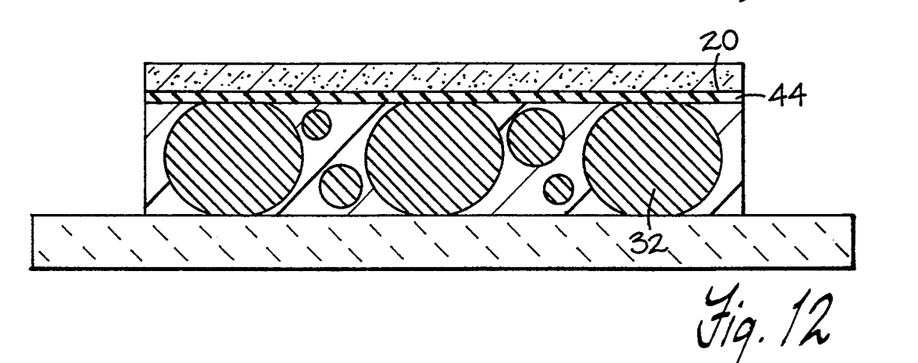
FIG. 12 shows an assembly similar to FIG. 5 with one surface a thin electrically insulative layer over an electronic component so that the filler provides thermal but not electrical conduction between the component and the opposite surface.
Figure 15:
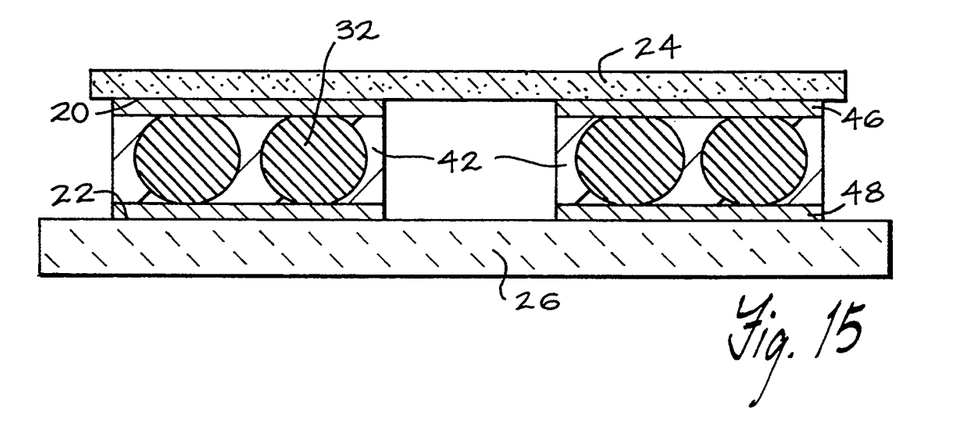
FIG. 15 shows an assembly similar to FIG. 13 with the filler selectively dispersed between the matching pairs of pads.
Figure 16:
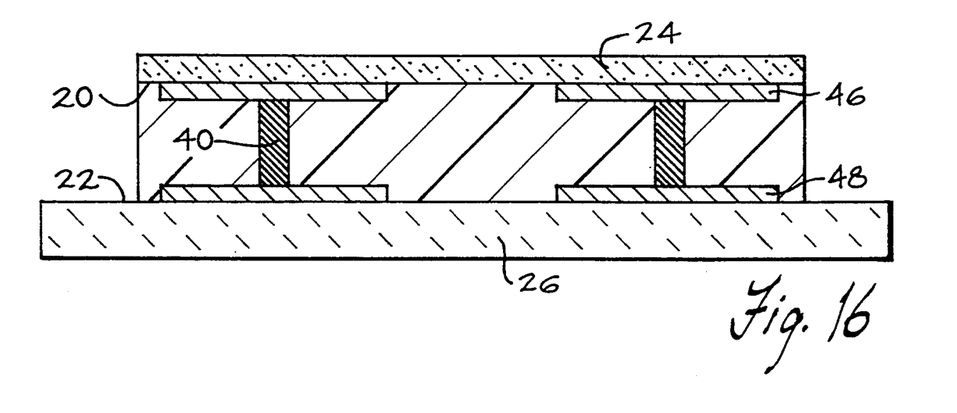
FIG. 16 shows an assembly similar to FIG. 10 with matching pairs of pads on the bonded surfaces connected by filler disposed in vias directly between the pads.
Figure 17:
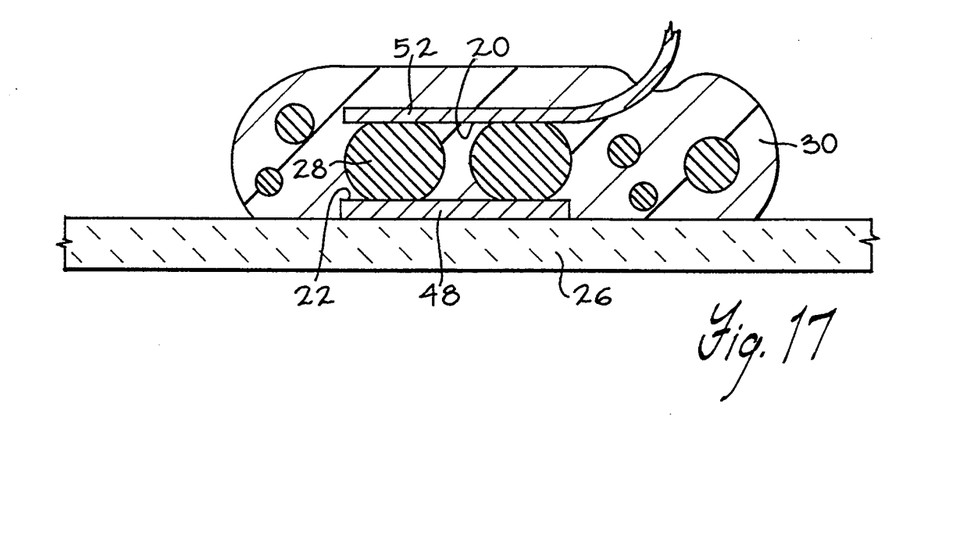
FIG. 17 shows an assembly similar to FIG. 5 wherein the filler surrounds an outer lead end and connects the outer lead end to a bonding pad.
Figure 18:
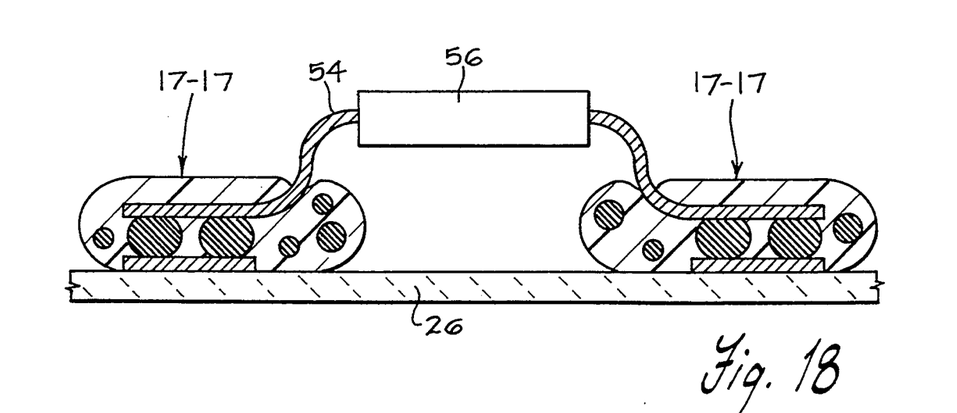
FIG. 18 shows a plurality of the assemblies of FIG. 17 for surface mounting an electronic component on a substrate.

In the embodiments shown in FIGS. 11–18, like parts similar to those previously discussed are similarly numbered and the descriptions need not be repeated. FIGS. 11–12 illustrate the use of the thermally conductive connection of the present invention as a die attach between a chip and substrate 26 keeping the chip and substrate electrically isolated from one another. FIGS. 13–16 illustrate using the thermally conductive connection to provide anisotropic electrical connections between matching pairs of pads on a chip and a substrate. FIGS. 17–18 illustrate using the thermally conductive connection to connect an outer lead end to a bonding pad for surface mounting an electronic component on a substrate.

Referring now to FIG. 11, the surfaces are electrically isolated by omitting the step (shown in FIG. 4) of bringing the surfaces 20 and 22 closer together. That is, surfaces 20 and 22 are still separated by length L1 when liquid epoxy 12 is hardened into solid epoxy 30. This prevents the filler regions 28 from contacting both surfaces. Thus, no continuous conductive bridges 32 between surfaces 20 and 22 are formed. While discontinuous regions 43 of gallium 14 fail to provide continuous electrical paths between the surfaces, regions 43 significantly increase the thermal conductivity between the surfaces.

Referring now to FIG. 12, the surfaces are electrically isolated by coating surface 20 with a thin insulating layer 44 such as 0.1 to 10 mils of nitride passivation or a diamond film. Insulating layer 44 is thin enough to electrically disconnect surface 20 from bridges 32 without substantially decreasing the thermal conductivity between surface 20 and bridges 32.

Figure 13:
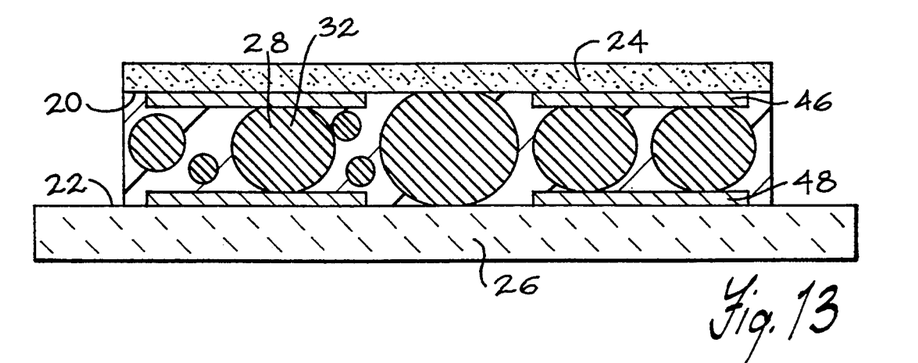
FIG. 13 shows an assembly similar to FIG. 5 with matching pairs of pads on the surfaces connected by filler randomly dispersed across the surfaces.

Referring now to FIG. 13, the thermally conductive connection is spread across the surfaces and randomly dispersed filler regions form anisotropic electrical connections between electrical pads on the bonded surfaces. Surface 20 comprises electrical bonding pads 46; surface 22 comprises electrical bonding pads 48. Pads 46 are in one-to-one correspondence with, and preferably are mirror representations of, pads 48. Upon vertically aligning chip 24 and substrate 26, pads 46 correspond in one-to-one relationship with pads 48 to form matching pairs of pads. That is, a single pad 46 lies directly above each pad 48 and vice versa. This method of attachment between electrical components is commonly referred to as "flip chip" bonding. Even though filler regions 28 are randomly distributed across surfaces 20 and 22, they are small enough yet packed densely enough with respect to pads 46 and 48 to assure that each matching pair of pads is interconnected by at least one metal bridge 32 without any non-matching pads being connected or bridged. In addition, the low viscosity of mixture 16 permits low assembly pressure which facilitates the flip chip assembly operation. In this embodiment the matrix material must be electrically insulative to assure anisotropic electrical connections between the pads.

Figure 14:
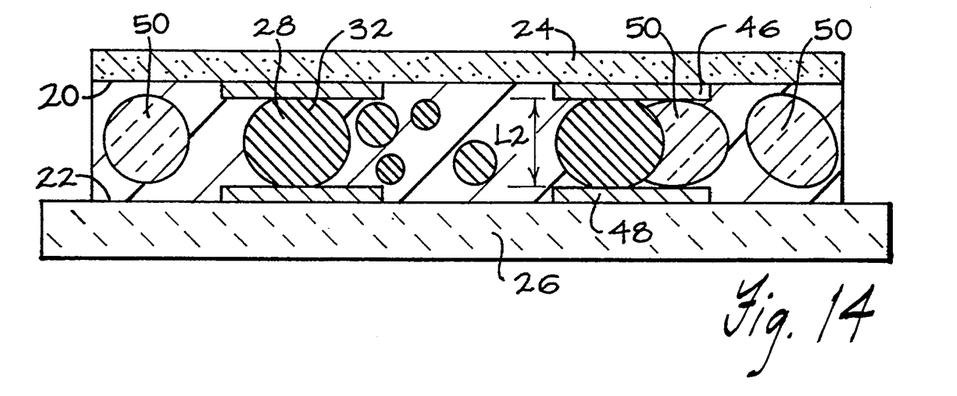
FIG. 14 shows an assembly similar to FIG. 13 further including spacer particles in the matrix material to assure a minimum distance between the surfaces.

Referring now to FIG. 14, solid spacer particles are included in the thermally conductive connection of the present invention in order to assure a minimum distance or spacing between the bonded surfaces. For example, glass beads 50 assure that surfaces 20 and 22 are spaced at least a distance L2 from one another. By preventing surfaces 20 and 22 from getting too close, the non-solidified filler is also prevented from spreading so far out laterally that it might connect non-matching pads. The spacer particles are particularly useful when dealing with small pad spacings and need not necessarily be identically sized. As is seen, certain of the filler regions have a larger diameter than the spacer particles to assure continuous filler paths between the surfaces. In this case, at least one of the filler regions contacts both surfaces before any of the spacer particles contact both surfaces. Thereafter, the surfaces are brought closer together until both surfaces contact at least one spacer particle.

Referring now to FIG. 1B, the thermally conductive connection is selectively disposed between the electrical pads on the bonded surfaces. In this embodiment the filler is confined to the area between (and perhaps in the immediate vicinity of) the pads. The area between surfaces 20 and 22 outside pads 46 and 48 is left as open space unless otherwise filled. Therefore, a relatively small amount of mixture 16 will suffice. In addition, glass beads 50 are unnecessary since the filler regions may properly coalesce. However, in comparison to the embodiment of FIG. 13 the overall thermal conductivity between surfaces 20 and 22 is decreased since bridges 32 no longer exist outside the pads. Likewise, the increased presence of the harder adhesive between the pads decreases the thermal conductivity as compared to disposing mostly filler between the pads.

Referring now to FIG. 16, filler regions disposed in predetermined vias form anisotropic electrical connections between electrical pads on bonded surfaces. As may be seen, vias 40 are positioned in one-to-one correspondence directly between each matching pair of pads 46 and 48. While a single gallium-filled via 40 is shown for each matching pair of pads, it should be noted that a plurality of smaller vias could connect each pair of pads. Furthermore, it is not mandatory that the vias be removed between non-matching pads. Since the vias are separate and spaced anisotropic conductors, a plurality of vias (not shown) can be positioned in contact with surfaces 20 and 22 outside pads 46 and 48 to provide additional thermally conductive paths between chip 24 and substrate 26 without connecting any non-matching pads. In this embodiment the matrix material must be electrically insulative to assure anisotropic electrical connections between the pads.

Referring now to FIG. 17, the thermally conductive connection of the present invention is shown as surrounding an outer lead end and connecting the outer lead end to a bonding pad. In this example, the upper surface 20 is provided by outer lead end 52 of lead 54, and lower surface 22 is provided by bonding pad 48 on substrate 26. Outer lead end 52 and bonding pad 48 are connected by a bond containing filler regions 28 and solid epoxy 30. Filler regions 28 are seen as thermally and electrically connecting lead end 52 to the underlying bond pad 48. In addition, solid epoxy 30 surrounds outer lead end 52 thereby enhancing the mechanical connection between the lead end and the pad.

Referring now to FIG. 18, a plurality of the assemblies of FIG. 17 are used for surface mounting an electronic component on a substrate. As may be seen, electrical component 56 comprises a plurality of outwardly extending leads 54. At the bonds, outer lead ends 52 are surrounded as well as connected to a plurality of bonding pads 48 in one-to-one relationship. That is, each lead is bonded and connected to a separate bonding pad. One such connection is shown in detail 17—17, the expanded view being FIG. 17. Returning to FIG. 18, this form of attachment is commonly referred to as "surface mounting." Surface mount attachment is applicable to a wide variety of electronic components and substrates. Rigid or flexible circuit attachment are two examples. It is further noted that, in the present illustration, the mechanical, electrical and thermal connection between component 56 and substrate 26 must include outer leads 54 as well as the bonds. While the electrical connection must include pads 48, the thermal and mechanical connections may include not only pads 48 but substrate 26 outside the pads as well. Nevertheless, filler regions 28 provide thermal and electrical connections between outer lead ends 52 and pads 48, solid epoxy 30 provides mechanical attachment between outer lead ends 52 and pads 48, and the remainder of component 56 is separated from and spaced above substrate 26. Component 56 may be attached to substrate 26 by 1) disposing mixture 16 of liquid epoxy 12 and liquid gallium 14 on pads 48, 2) inserting the outer lead ends 52 into mixture 16 on pads 48 such that filler regions 28 contact outer lead ends 52 and pads 48, and then 3) transforming liquid epoxy 12 into solid epoxy 30.

The inclusion of a liquid metal component in the present invention makes the preferred applications those where the joined surfaces are not subject to attack by the liquid metal itself. For instance, in the event the liquid metal is gallium then aluminum and copper surfaces would require surface coatings or preparations to allow a reliable interface to be maintained. Aluminum and gallium react to cause aluminum embrittlement. Furthermore, gallium at a bare aluminum surface tends to migrate along the grain boundaries of the aluminum. Within a short time a vast majority of the gallium may migrate from the interface which would degrade the thermal performance of the adhesive. Copper and gallium react to form various compounds. Over time the liquid gallium at the interface may be consumed by these reactions.

In order to avoid these problems, the aluminum and copper can be passivated by coating with an appropriate material such as by electroplating, chemical vapor deposition, explosive forming, roll bonding, and so on. Aluminum (but not copper) can be protected by anodization and aluminum nitride. Both Aluminum and copper can be protected by thermal spray of alumina, nickel plating, nickel plating and subsequent heat treatment to form nickel compounds, chemical vapor deposition of tungsten, and cladding with tungsten, tantalum or molybdenum. Aluminum and copper can also be protected by coating a metal which yields a refractory oxide and then oxidizing the metal to form a continuous refractory oxide layer. Suitable metals that can form a refractory oxide include nickel, chromium, titanium, tantalum, yttrium, scandium, zirconium and niobium.

It is possible that, under proper conditions, a coating which reacts with the liquid metal may become a more effective barrier by reducing or closing the pinholes in itself. By way of example, a copper coating on an aluminum surface may react with gallium to form a reaction product which fills and closes the pinholes in the copper thereby decreasing the risk of gallium contacting the aluminum and causing aluminum embrittlement.

The appropriate coating must be conductive or resistive depending on whether the coated surface is to be electrically connected to or electrically isolated from the liquid metal, respectively. For example, aluminum and copper can be protected and electrically insulated from the gallium with alumina or a sufficiently thick continuous refractory oxide layer.

In the event the filler 14 is a paste, the preferred approach is to coat the aluminum or copper with the same material that is the particulate solid constituent of the paste, such as tungsten, in order to inhibit dissolution of the protective coating into the paste, although for most coatings the dissolution is slow or the coating inhibits diffusion into the bulk material.

The following non-limiting examples are provided to further illustrate the present invention. These examples are meant to illustrate and not to limit the invention, the scope of which is defined solely by the appended claims.

EXAMPLE 1

Applicant has reduced the invention to practice by stirring a batch of two-part Devcon 5-minute liquid epoxy resin with liquid gallium. The liquid gallium was dispersed in substantially spherical regions approximately 1–20 mils in diameter and occupied 50% of the mixture by volume. (Although not investigated, allowing the liquid gallium to occupy 20% to 70% of the mixture by volume was considered acceptable.) The epoxy was given 30 minutes to harden at room temperature. The hardened material was examined qualitatively for its appearance, hardness and electrical conductivity. Each sample was found acceptable. No substantial visual changes were noted after one year.

EXAMPLE 2

Similar to Example 1 except the mixture was used to bond glass slides together and the one year period between forming and inspecting the bond was omitted. After mixing and forming a dispersion of very tiny gallium droplets within the liquid adhesive, a dollop of the gallium/adhesive was placed on the surface of a glass slide. Another glass slide, smaller than the first, was pressed against the adhesive on the larger glass slide, forcing adhesive to flow from between the two glass surfaces leaving a very thin bond of approximately 2 mils thick. This process was performed with the gallium filler in a liquid state. Thereafter the Devcon epoxy was cured by chemical reaction of the two-part adhesive mixture. FIG. 19 is a photomicrograph showing 100 × magnification of the interface between the adhesive bonding material and a glass slide as seen through the slide. The liquid gallium is seen as lightly shaded regions; the epoxy appears dark. As may be seen, the liquid gallium bridged across the cured adhesive bondline and wet the glass. FIG. 20 is the same at 200 × magnification.

EXAMPLE 3

Similar to Example 2 except liquid gallium was mechanically mixed into two different UV curable adhesives—Locite 366 and Borden 284-185-1. Each of these adhesives was liquid until exposed to UV light for curing. The amount of gallium was weighed to be approximately 20% by volume. Glass beads approximately 45 microns in diameter were then mixed into some but not all of the adhesives. After mixing and forming a dispersion of very tiny gallium droplets within the liquid adhesive, the mixtures were placed between glass slides and pressure was applied with the gallium filler in a liquid state. Subsequently, these assemblies were exposed to UV light for 60 seconds to fully cure the material bonding the glass slides to one another. After bonding, visual inspection clearly showed that liquid metal regions bridged across the cured adhesive bondline wetting the glass on each side. This was apparent since the same filler dispersion pattern was visible when viewing from each side of the bond. It was also clear that the glass beads limited the contact area of the liquid metal regions.

EXAMPLE 4

Two copper blocks were attached with the Devcon 5 minute epoxy containing a liquid gallium filler. The amount of gallium was weighed to be approximately 20% by volume of the bond. For comparison, two other copper blocks were also attached with the Devcon 5 minute epoxy only. Both samples were prepared by pressing the respective copper blocks together to form the thinnest bondline achievable. The unfilled and filled attachments were approximately 1–2 mils thick. The thermal resistance of each sample was then measured using the test method described by Thomas P. Dolbear in "Liquid Metal Paste for Thermal Connections", *Proceedings of the International Electronic Packaging Society* (IEPS), September, 1992, pp. 475–485. The thermal resistance for the attachment with the unfilled epoxy was 0.75° C.-sqcm/W whereas the thermal resistance of the attachment using the liquid gallium filled epoxy was 0.11° C. sqcm/W. Thus, the liquid metal filler substantially reduced the thermal resistance of the attachment. Moreover, the thermal resistance of the liquid metal filled attachment was both lower and less sensitive to bondline thickness than that obtainable with conventional solid filled adhesive attachments.

While the present invention is described primarily in terms of a thermally conductive attachment between a chip and a substrate, it will be understood that the invention has more general utility with respect to other types of heat sink attachment, electrical attachment, adhesive "flip-chip" bonding, and multi-chip module implementation.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of providing a thermally conductive connection between spaced surfaces, comprising the steps of:
    (a) mixing a thermally conductive filler containing a liquid metal into an unhardened matrix material; and
    (b) contacting said unhardened matrix material and randomly dispersed, separate spaced non-solidified regions of said filler within said unhardened matrix material to said surfaces.

2. The method of claim 1, further comprising:
    (c) transforming said unhardened matrix material into a solid mechanical bond between said surfaces.

3. The method of claim 2 wherein said unhardened matrix material is selected from the group consisting of thermoplastic materials, thermosetting materials, ultraviolet curable materials, epoxies, and solvent-bearing materials.

4. The method of claim 1, further comprising:
    (c) preventing said unhardened matrix material from transforming into a solid mechanical bond between said surfaces.

5. The method of claim 1, further comprising:
    (d) contacting an unhardened adhesive to said surfaces and an outer region of said unhardened matrix material; and
    (e) transforming said unhardened adhesive into a solid mechanical bond between said surfaces.

6. The method of claim 5 wherein said unhardened adhesive is selected from the group consisting of silicones, epoxies and acrylics.

7. The method of claim 1 further comprising, in sequence:
    contacting said unhardened matrix material which is thermoplastic and a first plurality of said regions to only one of said surfaces;
    transforming said unhardened matrix material into a solid matrix material;
    contacting said solid matrix material to the other of said surfaces;
    transforming said solid matrix material back into said unhardened matrix material;
    contacting said unhardened matrix material and a second plurality of said regions to the other of said surfaces; and then
    transforming said unhardened matrix material back into a solid matrix material thereby providing a solid mechanical bond between said surfaces.

8. The method of claim 1 wherein said regions have random sizes and shapes.

9. The method of claim 1 wherein said filler wets at least one of said surfaces.

10. The method of claim 1 wherein said filler consists essentially of a liquid metal.

11. The method of claim 10 wherein said filler consists of a liquid metal.

12. The method of claim 9 wherein said liquid metal is selected from the group consisting of gallium, gallium/indium, gallium/tin, gallium/indium/tin, mercury, and combinations thereof.

13. The method of claim 1 wherein said unhardened matrix material is sufficiently viscous to prevent said regions from coalescing or separating after said regions contact said surfaces.

14. The method of claim 1 wherein said unhardened matrix material is selected from the group consisting of liquids, gels, greases, oils and pastes.

15. The method of claim 1 wherein said unhardened matrix material consists essentially of an oil.

16. The method of claim 15 wherein said unhardened matrix material consists of an oil.

17. The method of claim 15 wherein said oil is selected from the group consisting of silicone oils and hydrocarbon oils.

18. The method of claim 1, further comprising:
    dispersing spacer particles into said unhardened matrix material; and
    contacting at least one of said spacer particles to both surfaces thereby assuring a spacing between said surfaces.

19. The method of claim 1 wherein said filler is dispersed throughout said unhardened matrix material and said filler occupies in the range of 20% to 70% of the volume of the mixture of said filler and said matrix material.

20. The method of claim 19 wherein said conductive filler occupies in the range of 30% to 50% of the volume of said mixture.

21. The method of claim 1 wherein a plurality of said regions contact both surfaces thereby forming separate continuous thermally conductive paths between said surfaces.

22. The method of claim 21 wherein said filler is electrically conductive and said plurality of said regions provide separate continuous electrically conductive paths between said surfaces.

23. The method of claim 22 wherein at least one of said surfaces is an insulating layer disposed on an electronic component thereby electrically insulating said component from said filler.

24. The method of claim 21 wherein said filler includes electrically conductive regions of said liquid metal surrounded by an insulative coating thereby rendering said filler electrically insulative.

25. The method of claim 21 further comprising, in sequence:
dispersing spacer particles into said unhardened matrix material;
contacting at least one of said plurality of regions to both of said surfaces without contacting any one of said spacer particles to both of said surfaces;
moving said surfaces closer together; and then
contacting at least one of said spacer particles to both of said surfaces thereby assuring a spacing between said surfaces.

26. The method of claim 1 wherein during step (b) a temperature of said filler is at most 160° C.

27. The method of claim 26 wherein said temperature of said filler is at most 100° C.

28. The method of claim 27 wherein said temperature of said filler is at most 40° C.

29. The method of claim 28 wherein said temperature of said filler is room temperature.

30. The method of claim 1 wherein at least one of said surfaces is a protective layer disposed on a metal thereby protecting said metal from attack by said liquid metal.

31. The method of claim 30, further comprising:
anodizing said metal, thereby forming said protective layer.

32. The method of claim 31 wherein said liquid metal is gallium and said metal is aluminum.

33. The method of claim 30, further comprising:
disposing a second metal on said metal; and
oxidizing said second metal to form a continuous refractory oxide layer which provides said protective layer.

34. The method of claim 33 wherein said liquid metal is gallium and said metal is selected from the group consisting of aluminum and copper.

35. The method of claim 34 wherein said second metal is selected from the group consisting of nickel, chromium, titanium, tantalum, yttrium, scandium, zirconium and niobium.

36. A thermally conductive connection between surfaces, comprising:
(i) a matrix material in contact with said surfaces,
(ii) a thermally conductive non-solidified filler containing a liquid metal, said filler randomly dispersed in separate spaced regions of said matrix material wherein a plurality of said regions contact both surfaces and form separate spaced continuous thermally conductive paths between said surfaces, and
(iii) an adhesive in contact with said surfaces and an outer region of said matrix material wherein said adhesive provides a solid mechanical bond between said surfaces.

37. A thermally conductive connection between surfaces, comprising:
(i) a matrix material in contact with said surfaces wherein said matrix material is selected from the group consisting of liquids, gels, greases, oils and pastes, and
(ii) a thermally conductive non-solidified filler containing a liquid metal, said fiber randomly dispersed in separate spaced regions of said matrix material wherein a plurality of said regions contact both surfaces and form separate spaced continuous thermally conductive paths between said surfaces.

38. A thermally conductive connection between surfaces, comprising:
(i) a matrix material in contact with said surfaces wherein said matrix material includes an oil, and
(ii) a thermally conductive non-solidified filler containing a liquid metal, said filler randomly dispersed in separate spaced regions of said matrix material wherein a plurality of said regions contact both surfaces and form separate spaced continuous thermally conductive paths between said surfaces.

39. A thermally conductive connection between surfaces, comprising:
(i) a matrix material in contact with said surfaces,
(ii) a thermally conductive non-solidified filler containing a liquid metal, said filler randomly dispersed in separate spaced regions of said matrix material wherein a plurality of said regions contact both surfaces and form separate spaced continuous thermally conductive paths between said surfaces, and
(iii) solid spacer particles wherein at least one of said spacer particles contacts both surfaces thereby assuring a spacing between said surfaces.

* * * * *